(12) United States Patent
Adams et al.

(10) Patent No.: US 6,205,656 B1
(45) Date of Patent: Mar. 27, 2001

(54) AUTOMATED APPLICATION OF PHOTOVOLTAIC CELLS TO PRINTED CIRCUIT BOARDS

(76) Inventors: Arthur Henry Adams, 29486 Quail Run Dr., Agoura Hills, CA (US) 91301; Sorhab Pourtahmassebi, 31440 Glenbridge Rd., Westlake Village, CA (US) 91361

( * ) Notice: Subject to any disclaimer, the term of this patent is extended or adjusted under 35 U.S.C. 154(b) by 0 days.

(21) Appl. No.: 08/942,568

(22) Filed: Oct. 1, 1997

(51) Int. Cl.[7] ....................................... H05K 3/34
(52) U.S. Cl. ............................. 29/840; 29/564.1; 29/740; 29/832
(58) Field of Search .................. 29/832, 564, 564.1, 29/740, 840

(56) References Cited

U.S. PATENT DOCUMENTS 3,849,880 * 11/1974 Haynos .
3,973,996 * 8/1976 Kennedy .
4,149,665 * 4/1979 Frosch .
4,219,926 * 9/1980 Frosch .................................. 29/832

* cited by examiner

Primary Examiner—Carl J. Arbes
(74) Attorney, Agent, or Firm—Robert J. Schaap

(57) ABSTRACT

An improved process for fabricating photovoltaic charging circuits including the steps of:

1. fabricating a circuit board by conventional techniques with photovoltaic piece mounting pads, islands, and traces suitable for interconnecting photovoltaic pieces in series with a LED and the cells of the rechargeable battery;
2. fabricating a suitable solder screen;
3. using the screen to apply solder dots to the piece mounting pads and the LED mounting pads;
4. using a pick and place machine to automatically place the pieces, conductive side up, onto the piece mounting pads and the LED onto the LED mounting pads;
5. heating the assembly to cause soldering of the rears of the pieces to the piece mounting pads and the LED to the LED mounting pads; and
6. electrically connecting the conductive sides to the islands.

8 Claims, 9 Drawing Sheets

AUTOMATED APPLICATION OF PHOTOVOLTAIC CELLS TO PRINTED CIRCUIT BOARDS

BACKGROUND OF THE INVENTION

The present invention relates to manufacturing of articles incorporating photovoltaic cells and more particularly deals with an improved process for manufacturing photovoltaic charging panels.

Photovoltaic cells have been cut up and made into circuits for years. This was done by hand soldering wire to first one side of a piece of cell and then to the opposite side. Since one side of each cell is negative, and the other is positive this process will produce an electrical circuit. However this process is slow, labor intensive and subject to a high failure rate. In the past this process has been used mostly for producing small panels that have been used in novelties or hobby products. Presently there are a large number of rechargeable devices such as cellular phones, laptop computers and cordless phones, that are capable of having their use extended by the use of a small, high output photovoltaic panels. For further details about these applications, please refer to U.S. patent application Ser. No. 08/1476,234.

Some related patents are described below.

U.S. Pat. No. 5,460,659 describes fabrication of small solar cells. Each cell is mounted on an individual carrier and electrical connections are made between the cell and the carrier by automated wire bonding. The carriers are then mounted and electrically connected to a substrate. Finally a concentrator lens is placed over the array.

U.S. Pat. No. 5,096,505 describes mounting of solar cells on a light weight, honeycomb panel. The cells are mounted on metallized surfaces of a heat spreader and a circuit carrier, adhered to the rear, is bonded to islands on one side of the heat spreader.

While the basic concepts presented in the above mentioned patents are of interest, and an improvement over traditional hand assembly, none of the processes employed create photovoltaic cell assemblies that are able to fit into rechargeable batteries for electronic devices and the processes use many more steps than are necessary.

Development of an improved process for manufacturing miniature, photovoltaic panels which can speed up and optimize the assembly process represents a great improvement in the field of electronics assembly and satisfies a long felt need of the electronics manufacturer.

SUMMARY OF THE INVENTION

The subject invention solves all of these fabrication problems in a new and unique manner which has not been part of the art previously. The present invention is an improved process for manufacturing charging circuits from pieces of photovoltaic cells. The photovoltaic pieces are interconnected to each other in series. Interconnection of the rears of the photovoltaic pieces to their fronts, in series is accomplished by automated soldering of the pieces to a specially designed, printed circuit board. The pieces are placed on the board by robotic means.

Additionally, the circuit incorporates a Light Emitting Diode (LED) to indicate whether a supplemental photovoltaic charge is being produced. The LED also functions as a backflow preventer to ensure that the device's battery does not discharge itself through the panel when the photovoltaic cells are not in use. The printed circuit incorporates a location for soldering the LED so that the LED can also be automatically soldered in place when the pieces are soldered to the circuit board. The circuit board design also incorporates a location for subsequent electrical connection to the rechargeable battery.

It is the object of the present invention to provide a process for making photovoltaic panels for a plethora of battery powered devices which is fast, easy, reproducible and low in cost. The main advantages of the present invention are:

it is much quicker than methods now in use;

failure rates are much lower than the methods now in use because the process is standardized and automated;

the output is consistently higher because of the use of circuit boards and automation;

the cost of producing photovoltaic panels is lower because of savings through standardization; and there is a savings in nationwide energy costs because of increased use of photovoltaic energy.

An appreciation of the other aims and objectives of the present invention and an understanding of it may be achieved by referring to the accompanying drawings and description of a preferred embodiment.

DETAILED DESCRIPTION OF THE PREFERRED EMBODIMENT

The new, improved process of this invention can best be understood by studying the Figures in sequence. The process thus described is for producing a cellular phone battery case for use in a battery which can be recharged by the sun or by conventional electrical means. The process described below goes from procuring of the photovoltaic cell to finishing of the battery case.

Figure 1:
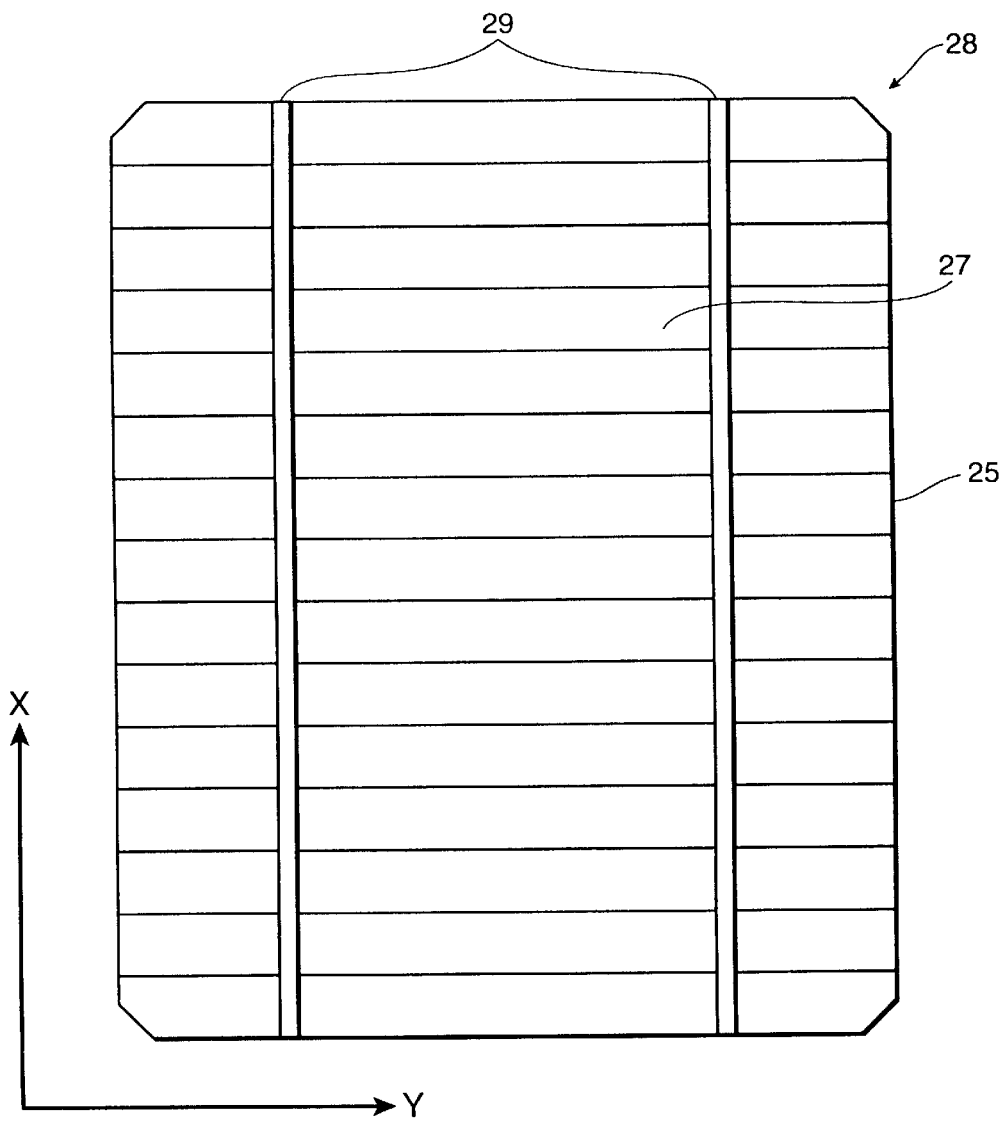
FIG. 1 is a plan view of a photovoltaic cell.

FIG. 1 shows a photovoltaic cell 28 with two bus bars 29. A standard photovoltaic cell has a dimension of 103 mm. The cell is shown conductive side 27 up and has a rear 25.

Figure 2:
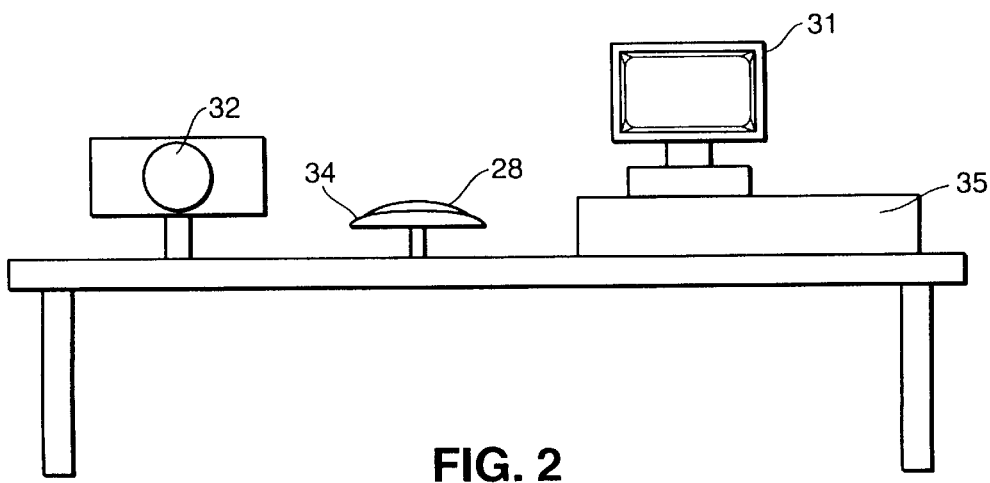
FIG. 2 is a side elevation view of a chip saw.

FIG. 2 illustrates a standard chip saw 35. The saw 35 includes a monitor 31, a cutting blade 32, and a vacuum chuck 34, which holds the photovoltaic cell 28 down during the cutting procedure. The cells 28 are cut along the bus bars 29 and then at intervals along the y axis to produce the pieces 35a. The standard interval is 2 cm.

Figure 3:
FIG. 3 is a plan view of a cut piece of a photovoltaic cell.

FIG. 3 shows a piece 35a of the photovoltaic cell 28 with the section of bus bar 29 still attached.

Figure 4:
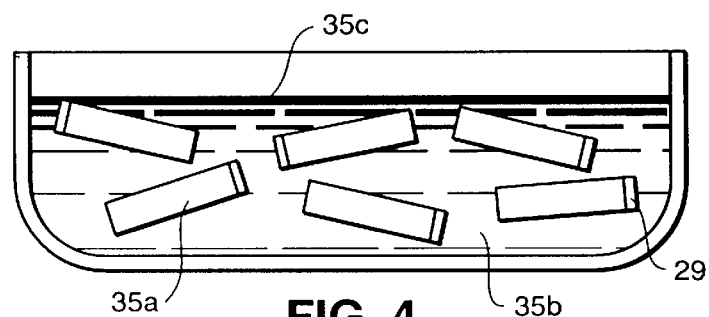
FIG. 4 is a cross-section view of photovoltaic pieces being cleaned in a cup of alcohol.

FIG. 4 shows the cells 35a in a bowl 35b of alcohol 35c to clean any particles off them that may have adhered after the cutting process.

Figure 5:
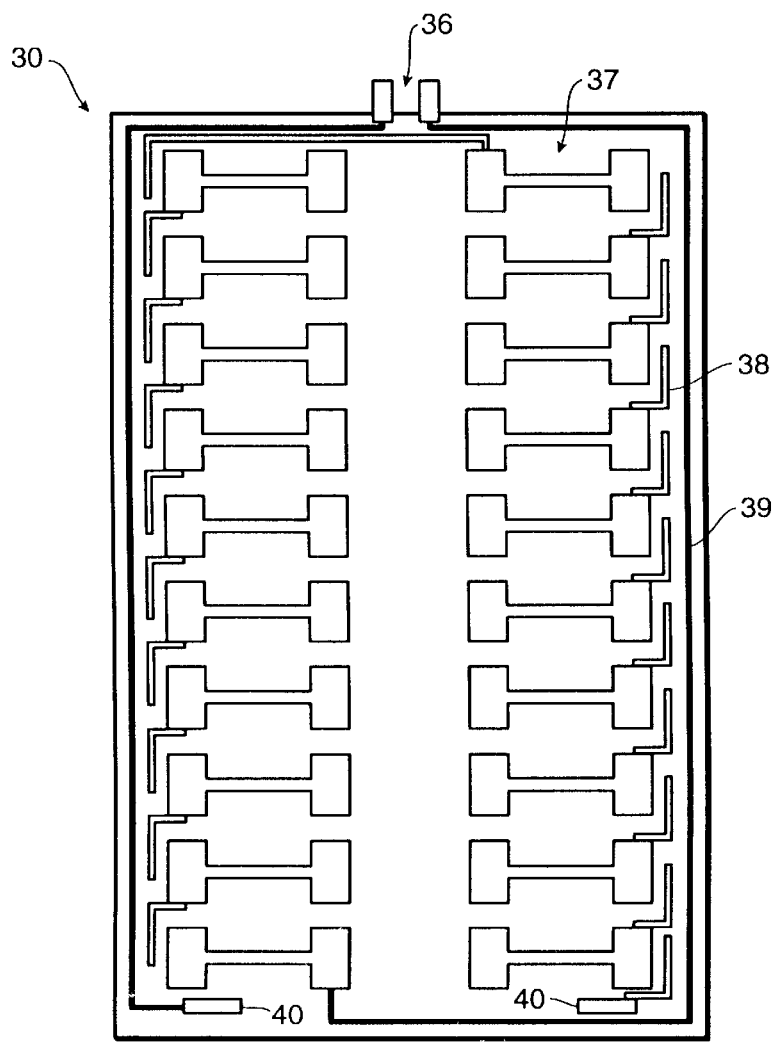
FIG. 5 is a plan view of a single sided circuit board design.

FIG. 5 is the circuit board 30 design for a cellular phone. The circuit includes H-shaped pads 37, which are connected to separated islands 38. The pads 37 are connected to traces 39 which terminate in two interconnecting pads 40, which are the connection points for the wires that connect to the battery pack (not illustrated), and two LED pads 36, which are where a LED (not illustrated) is attached. The LED shows that the unit is functional and also works as a current backflow preventer during times of darkness. Eventually the photovoltaic pieces 35a are placed on the circuit board 30, conductive side up, on the H-shaped pads 37. While a single sided circuit board is illustrated, it is clear that double sided boards could be used in this and other applications.

Figure 6:
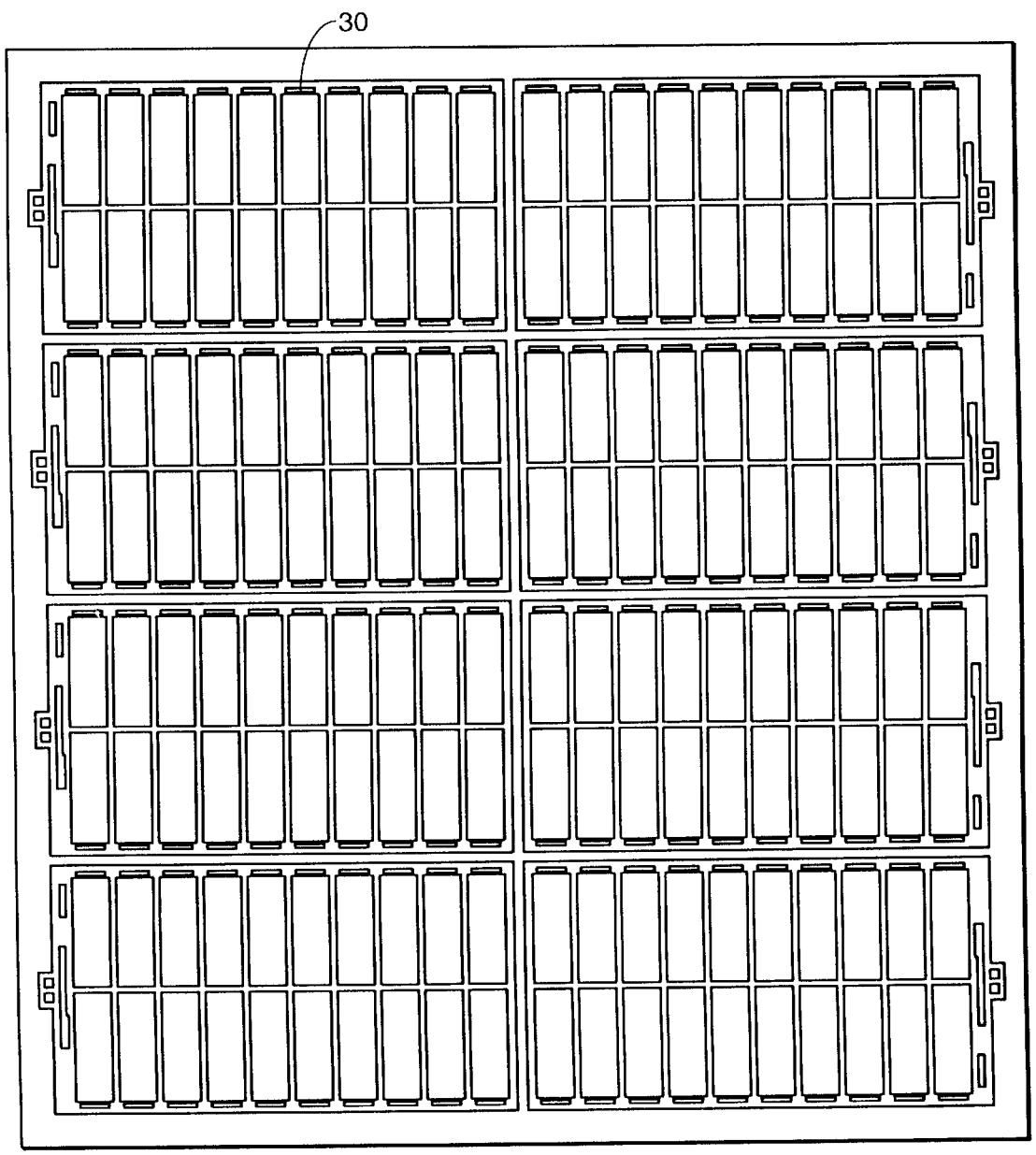
FIG. 6 is a plan view of an 8 unit circuit board.

FIG. 6 shows the circuit boards 30 in an 8 up array.

Figure 7:
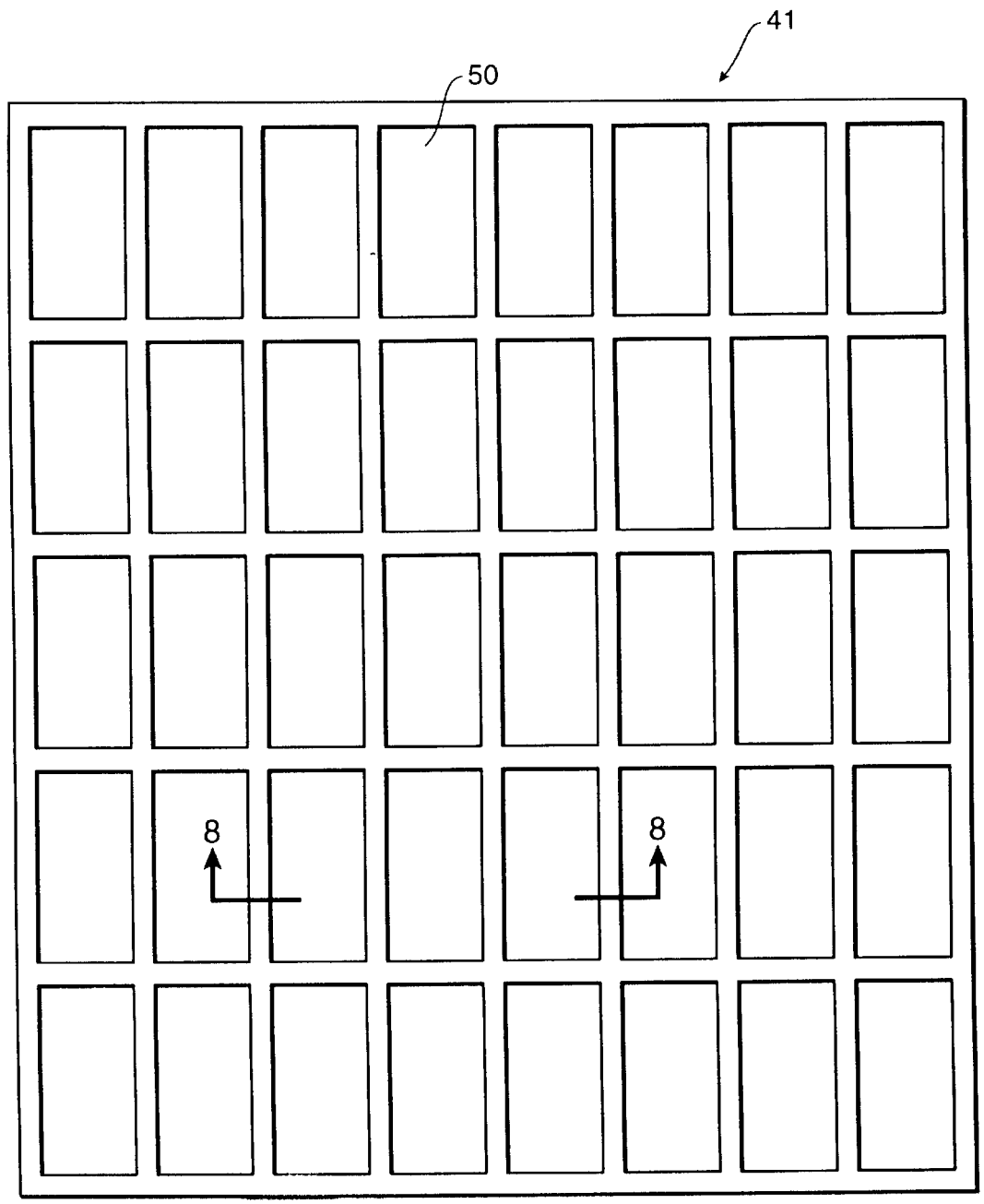
FIG. 7 plan view of plastic photovoltaic cell tray with spaces for 160 cells.

FIG. 7 shows the plastic cell tray 41 that is sized to accept the photovoltaic pieces 35a.

Figure 8:
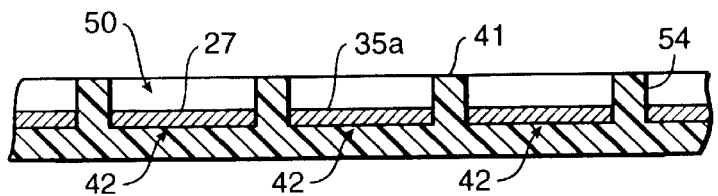
FIG. 8 is a cross section of the tray shown in FIG. 7 showing photovoltaic cell fit.

FIG. 8 shows the cut photovoltaic cells 35a in the plastic tray 41. The cells 35a are placed in the tray 41 by hand and are placed conductive side 27 up. Each depression 50 of the tray 41 has a side wall 54 and a bottom 42.

Figure 9:
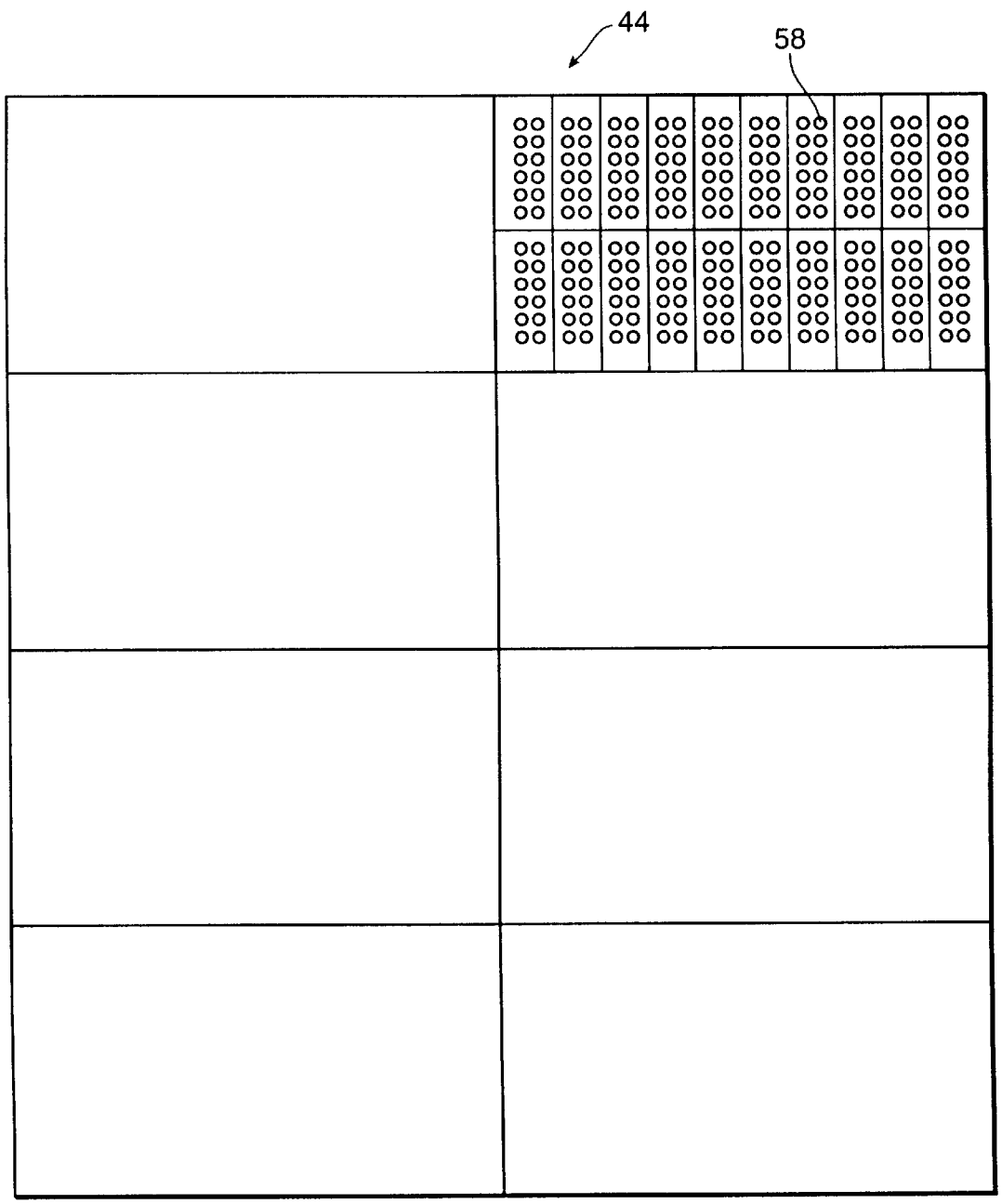
FIG. 9 is a plan view of a metal solder screen.

FIG. 9 illustrates a metal solder screen 44 which is used to apply solder to the circuit board 30. The solder screen 44 fits exactly over the 8 up circuit board array illustrated in FIG. 6. Holes 58 permit paste solder to be screened onto the circuit solder pads 37 and the LED mounting pads 36.

Figure 10:
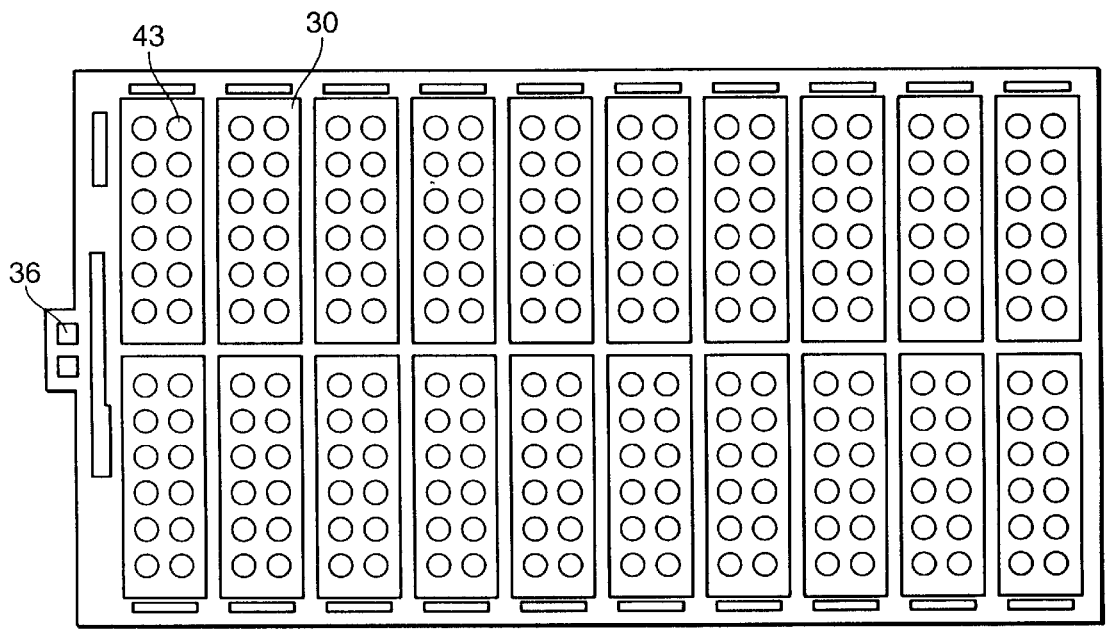
FIG. 10 is a plan view of a circuit board with the solder dots on it.

FIG. 10 shows the solder dots 43 screened onto the circuit board 30.

Figure 11:
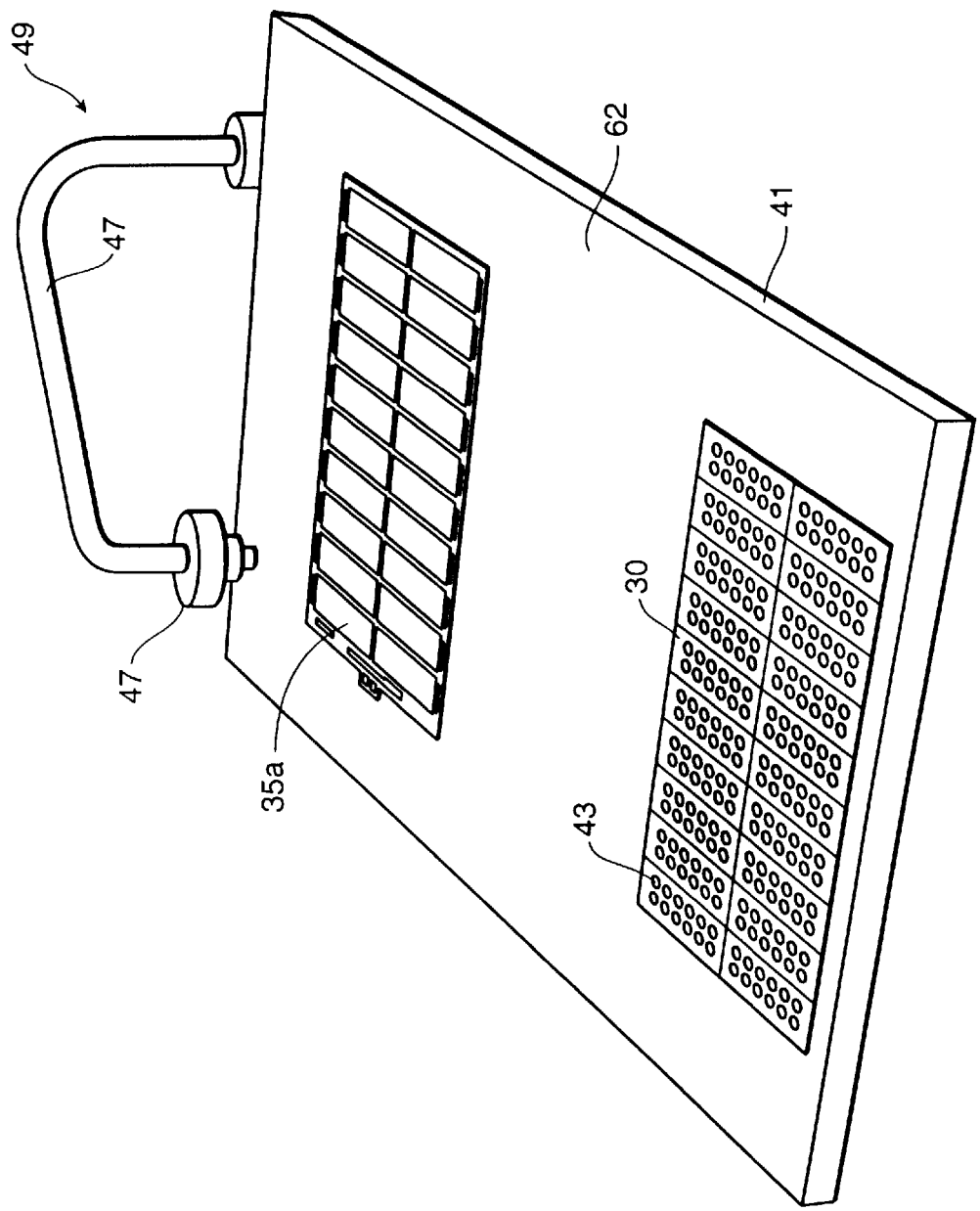
FIG. 11 is an elevation view of the automated pick and place machine picking up the cells from the tray and placing them on the circuit board.

FIG. 11 shows an elevated view of the pick and place machine 49. The circuit board 30, and the tray 41, filled with the photovoltaic pieces 35a, placed conductive side 27 up, are placed on the bed 62 of the machine 49. The operative part of the machine 49 is its arm 47. A pick and place machine 49 is a robotic machine that can be programmed to rapidly and accurately move parts from one place to another. Thus this machine 49 can easily move the pieces 35a from each depression 50 in the tray to each pad 37 on the circuit board 30 and an LED 66 to the LED mounting pads 36.

Figure 12:
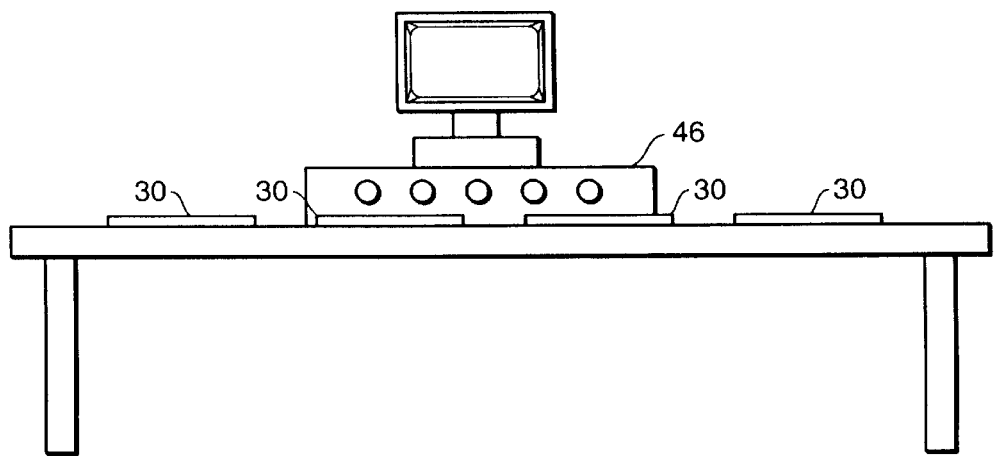
FIG. 12 is an elevation view of the circuit boards on a conveyor belt going through an infrared oven.

FIG. 12 is an elevation of an infrared (IR), oven 46 with three circuit boards 30 going through it. As they go through the oven 46 the photovoltaic pieces 35a are soldered by the heat to the circuit board 30.

Figure 13:
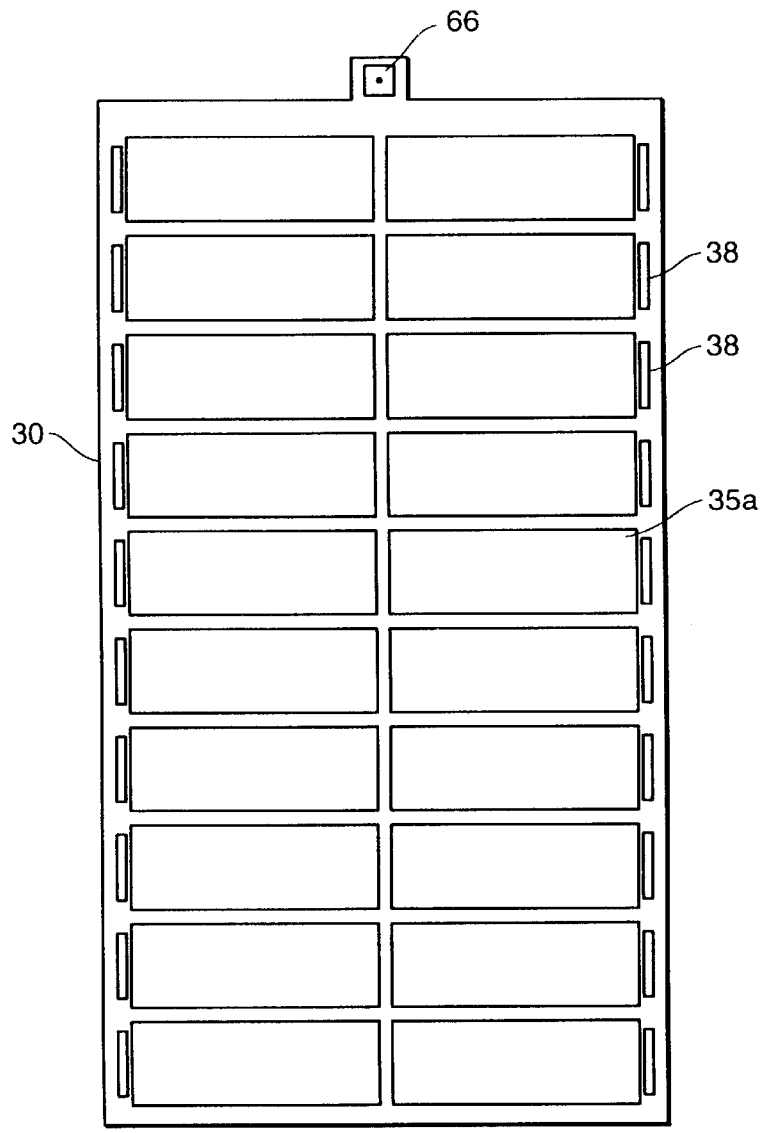
FIG. 13 is a plan view of photovoltaic cells and LEDs on the circuit board.

FIG. 13 shows the circuit board 30 with the photovoltaic cells 35b placed on the solder pads 37 and soldered by the pass through the IR oven 46. Also the LED 66 is soldered in the oven to its pad 36 at the top of the circuit board.

Figure 14:
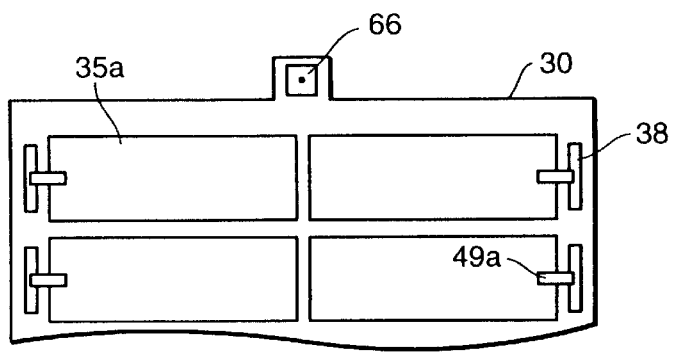
FIG. 14 is a plan view of the side connections being soldered by hand.

FIG. 14 shows the circuit board 30 after the conductive sides of the photovoltaic pieces 35a have been hand soldered 49a to the islands 38. Connections 49a are preferably made by hand soldering or wire bonding. At this stage a completed charging circuit 23 has been produced. Using the specially designed circuit board 30, solder screen 44 and pick and place machine 49, as described above, adjacent photovoltaic pieces 35a have been connected conductive side 27 to rear 25 or in series.

Figure 15:
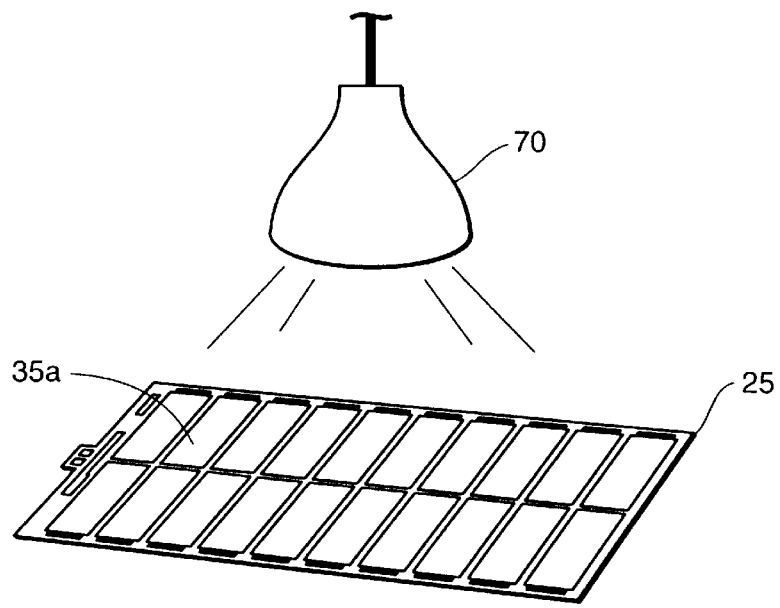
FIG. 15 is an elevation view of boards being tested under a light.

FIG. 15 shows testing the charging circuit 23 with a light 70 placed above the circuit photovoltaic pieces 35a. Preferably the light 70 is 250 watts and placed 19 inches from the photovoltaic pieces 35a at 70° F. Under such standard conditions charging circuits 25 should output between 8–9 volts at 45 Mah.

Figure 16:
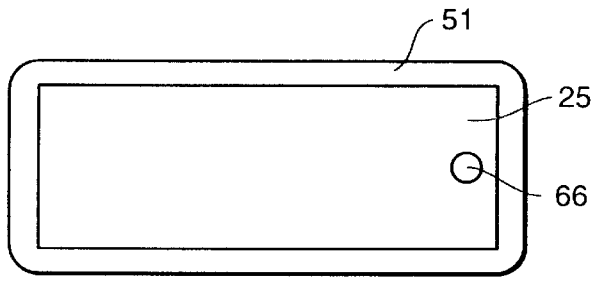
FIG. 16 is a plan view of boards being inserted into a plastic case.

FIG. 16 shows the charging circuit 23 with installed LED 66 inserted into the top of a cellular phone battery case 51.

Figure 17:
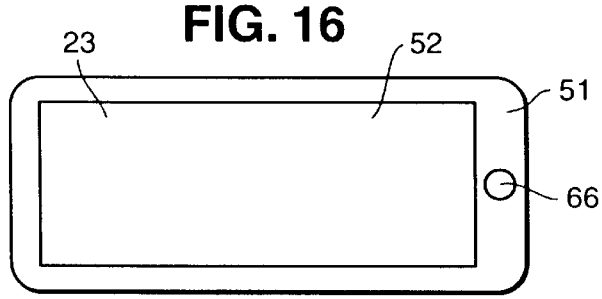
FIG. 17 is a plan view of two part epoxy being poured into the case top to protect the photovoltaic cells.

FIG. 17 shows the charging circuit 23 with installed LED 66 in the cellular phone case 51 being covered with epoxy 52 for strength and resistance to damage.

Figure 18:
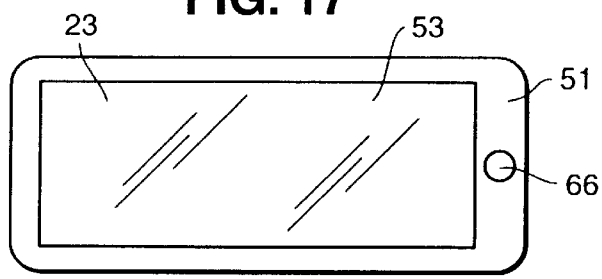
FIG. 18 is a plan view of photovoltaic cells being protected by a clear plastic top.

FIG. 18 shows the charging circuit 23 in the cellular phone case 51 being protected by a clear, hard, plastic top piece 53 instead of the poured epoxy 52.

To summarize, the old process for producing charging circuits 25 includes the steps of:

1. cutting photovoltaic cells 38 into pieces 35a;
2. cleaning the pieces 35a;
3. hand soldering or wire bonding connecting wires to the rears 25 of the pieces 35a;
4. fastening the pieces 35a to a substrate;
5. connecting the connecting wires to the conductive sides 27 of the pieces 35a to connect the pieces 35a in series; and
6. connecting a LED 66 to the circuit in series.

The charging circuit 23 is usually subsequently protected by a clear epoxy top coat 52 or a specially manufactured hard plastic top piece 53.

The new, improved process represented in this document essentially replaces the hand soldering and fastening steps by the following steps:

1. fabricating a circuit board 30 by conventional techniques with pads 37, 40, 36, islands 38, and traces 39 suitable for interconnecting the pieces 35a in series with a LED 66 and the cells of the rechargeable battery;
2. fabricating a suitable solder screen 44;
3. applying solder dots 43 to the piece mounting pads 37 the LED mounting pads 36 by using the screen;
4. automatically placing the pieces 35a, conductive side 27 up, onto the piece mounting pads 37 and placing a LED 66 on the LED mounting pads 36 by using a pick and place machine 49;
5. heating the assembly to cause soldering of the rears 25 of the pieces 35a to the piece mounting pads 37 and the LED 66 to the LED mounting pads 36; and
6. electrically connecting the conductive sides 27 to the islands 38, preferably by hand soldering or wire bonding.

There has been described and illustrated herein an improved process which provides a highly efficient, low cost way of making photovoltaic panels for charging any electronic device that uses rechargeable batteries. The panels keep the batteries topped off so they will last twice as long. If more of these panels are used in battery powered devices fewer batteries will end up in landfills. Furthermore, the use of this process will save energy nationwide by enabling use of sunlight instead of fossil fuels to charge rechargeable batteries. Devices include marine transceivers, pagers, cordless phones, cellular phones, walkie talkies laptop computers, toy trucks and numerous hand tools. However, it should be recognized that this improved process is, generically, automatic application of photovoltaic cells to printed circuit boards and can have applications broader than just rechargeable batteries.

The following reference numerals are used on FIGS. 1 through 18:

- 23 Charging circuit
- 25 Rear of photovoltaic cell
- 27 Conductive side of photovoltaic cell
- 28 Photovoltaic cell
- 29 Bus bar
- 30 Circuit board
- 31 Monitor
- 32 Cutting blade
- 34 Vacuum chuck
- 35 Chip saw
- 35a Photovoltaic piece
- 35b Bowl
- 35c Alcohol
- 36 LED attachment pad
- 37 Photovoltaic piece mounting pad
- 38 Island
- 39 Trace
- 40 Interconnection pad
- 41 Piece holding tray
- 42 Bottom of depression
- 43 Solder dots
- 44 Solder screen
- 46 Infrared oven
- 49 Pick and place machine
- 49a Solder connection
- 50 Depression
- 51 Battery case
- 52 Epoxy coating
- 53 Hard plastic top piece
- 54 Side wall
- 58 Hole in solder screen
- 62 Bed of machine
- 66 LED
- 70 Test light While particular embodiments of the invention have been described, it is not intended that the invention be limited exactly thereto, as it is intended that the invention be as broad in scope as the art will permit. The forgoing descriptions and drawings will suggest other embodiments and variations within the scope of the following claims to those skilled in the art, all of which are intended to be included in the spirit of the invention as herein set forth.

What is claimed is:

1. A method of automatically applying photovoltaic cells to printed circuit boards for use with rechargeable batteries comprising the steps of:
   a. providing a pick and place machine, a plurality of photovoltaic cell pieces, and a LED; each of said pieces including a conductive side and a rear;
   b. providing a relatively rigid printed circuit board having a coating which imparts rigidity to the board and fabricating the board with a plurality of piece mounting pads, a plurality of spaced apart islands initially electrically isolated from one another, and which islands are connected to yet separated from said piece mounting pads, at least two LED mounting pads and a plurality of traces; said printed circuit board being designed for interconnecting a plurality of pieces in series with a LED and a connector for connecting to a rechargeable battery;
   c. fabricating a solder screen designed to apply solder dots to said piece mounting pads and said LED mounting pads;
   d. using said screen having holes to apply solder dots to said piece mounting pads and said LED mounting pads, said holes being arranged to permit a molten solder to be screened onto the respective piece mounting pads and LED mounting pads and where the solder provides the primary mounting force in absence of an adhesive for holding each piece on the pieces mounting pads and LED on the LED mounting pads;
   e. using said pick and place machine to automatically place said plurality of pieces, conductive side up, onto said piece mounting pads and said LED on said LED mounting pads;
   f. heating said assembled printed circuit board, pieces, and LED to cause soldering of said rears of said pieces to said piece mounting pads and said LED to said LED mounting pads and which serve to rigidly hold the cell pieces and LED on the piece mounting pads and LED mounting pads; and
   g. electrically connecting said conductive sides to said islands.

2. A method of automatically applying photovoltaic cells to printed circuit board for use with rechargeable batteries comprising the steps of:
   a. providing a plurality of photovoltaic cell pieces and a LED; each of said pieces including a conductive side and a rear;
   b. providing a relatively rigid printed circuit board having a coating which imparts rigidity to the board and fabricating the board with a plurality of piece mounting pads, a plurality of spaced apart islands initially electrically isolated from one another, and which islands are connected to yet separated from said piece mounting pads, at least two LED mounting pads and a plurality of traces; said printed circuit board being designed for interconnecting a plurality of pieces in series with a LED and a connector for connecting to a rechargeable battery;
   c. automatically applying solder dots to said piece mounting pad and said LED mounting pads and which serve, in absence of an adhesive, to rigidly hold the cell pieces and LED on the piece mounting pads and LED pads;
   d. robotically placing said plurality of pieces, conductive side up, onto said piece mounting pads and said LED on said LED mounting pads;
   e. heating said assembled printed circuit board, pieces, and LED to cause soldering of said rears of said pieces to said piece mounting pads and said LED to said LED mounting pads and where the solder provides the primary mounting force in absence of an adhesive for holding each piece and the LED on the piece mounting pads and LED on the LED mounting pads; and
   f. electrically connecting said conductive sides to said islands.

3. A method of automatically applying photovoltaic cells to printed circuit boards comprising the steps of:

a. providing a pick and place machine, and a plurality of photovoltaic cell pieces; each of said pieces including a conductive side and a rear side;

b. providing a relatively rigid printed circuit board having a coating which imparts rigidity to the board and fabricating the board with a plurality of piece mounting pads, a plurality of spaced apart islands initially electrically isolated from one another, and which islands are connected to yet separated from said piece mounting pads, and a plurality of traces; said printed circuit board being designed for interconnecting a plurality of pieces in series;

c. fabricating a solder screen having holes designed to solder dots to said piece mounting pads;

d. using said screen to apply solder dots to said piece mounting pads and which serve to rigidly hold the cell pieces on the piece mounting pads and where the solder provides the primary mounting force, in absence of an adhesive, for holding each the cell pieces on the pieces mounting pads;

e. using said pick and place machine to automatically place said plurality of pieces, conductive side up, onto said piece mounting pads;

f. heating said assembled printed circuit board, and pieces to cause soldering of said rear side of said pieces to said piece mounting pads and which serve to rigidly hold the cell pieces on the piece mounting pads; and g. electrically connecting said conductive sides to said islands.

4. A method of automatically applying photovoltaic cells to printed circuit boards comprising the steps of:

a. providing a plurality of photovoltaic cell pieces; each of said pieces including a conductive side;

b. providing a relatively rigid printed circuit board having a coating which imparts rigidity to the board and fabricating the board with a plurality of piece mounting pads, a plurality of spaced apart islands initially electrically isolated from one another, and which islands are connected to yet separated from said piece mounting pads, and a plurality of traces; said printed circuit board being designed for interconnecting a plurality of pieces in series;

c. automatically applying solder dots to said piece mounting pad which serve to rigidly hold the cell pieces on the piece mounting pads;

d. robotically placing said plurality of pieces, conductive side up, onto said piece mounting pads;

e. heating said assembled printed circuit board, pieces to cause soldering of said pieces mounting pads and which serve to rigidly hold the cell pieces on the piece mounting pads and where the solder provides the primary mounting force, in absence of an adhesive, for holding each the cell pieces on the pieces mounting pads; and f. electrically connecting said conductive sides to said islands.

5. A method of fabricating a solar and electrical rechargeable battery comprising the steps of:

a. providing a pick and place machine, a plurality of photovoltaic cell pieces, a rechargeable battery cell, a LED, a charging contact and a battery case, each of said pieces including a conductive side and a rear, said case having an inside and an outside and a slot adapted to receive said charging contact; said charging contact designed to charge said battery cell of a battery with electrical power when said battery is inserted in its charging cradle and to charge said battery cell by solar power, if possible, when said battery is not inserted in its charging cradle;

b. creating a solar charging circuit by the steps of:

i. providing a relatively rigid printed circuit board having a coating which imparts rigidity to the board and fabricating the board with a plurality of piece mounting pads, a plurality of spaced apart islands initially electrically isolated from one another, and which islands are connected to yet separated from said piece mounting pads, at least two LED mounting pads and a plurality of traces; said printed circuit board being designed for interconnecting a plurality of pieces in series with a LED and said rechargeable battery cell;

ii. fabricating a solder screen having holes designed to apply solder dots to said piece mounting pads and said LED mounting pads;

iii. using said screen to apply solder dots to said piece mounting pads and said LED mounting pads, said holes being arranged to permit a molten solder to be screened onto the respective piece mounting pads and LED mounting pads;

iv. using said pick and place machine to automatically place said plurality of pieces, conductive side up, onto said piece mounting pads and said LED on said LED mounting pads;

v. heating said assembled printed circuit board, pieces, and LED to cause soldering of said rears of said pieces to said piece mounting pads and said LED to said LED mounting pads and which serve to rigidly hold the cell pieces and LED on the piece mounting pads and LED mounting pads and where the solder provides the primary mounting force, in absence of an adhesive, for holding each piece and the LED on the pieces mounting pads and LED on the LED mounting pads; and vi. electrically connecting said conductive sides to said islands;

c. attaching said charging circuit contact associated with a charging circuit to said case, said case being adapted to receive said charging circuit on its outside;

d. electrically connecting said battery cell and said charging contact to said charging circuit;

e. inserting said charging contact into said slot; and f. fastening said battery cell inside said case.

6. A method as claimed in claim 5 further comprising the step of applying a clear protective coating to said charging circuit.

7. A method as claimed in claim 5 further comprising the step of fastening a hard, clear plastic top piece to said charging circuit.

8. A method of automatically applying photovoltaic cells to printed circuit boards for use with rechargeable batteries comprising the steps of:

a. providing a roboticly operated pick and place machine, a plurality of photovoltaic cell pieces; each of said pieces including a conductive side and a rear;

b. providing a relatively rigid printed circuit board having a coating which imparts rigidity to the board and fabricating the board with a plurality of piece mounting pads, a plurality of spaced apart islands initially electrically isolated from one another, and which islands are connected to yet separated from one another and connected to said piece mounting pads, and a plurality of traces; said printed circuit board having a printed circuit designed for electrically interconnecting a plurality of pieces in circuit arrangement with a connector for connecting to a rechargeable battery;

c. fabricating a solder screen having holes designed to apply solder dots to said piece mounting pads and said LED mounting pads;

d. using said screen having holes to apply solder dots to said piece mounting pads, said holes being arranged to permit a molten solder to be screened onto the respective piece mounting pads;

e. using said pick and place machine to automatically place said plurality of pieces, conductive side up, onto said piece mounting pads;

f. heating said assembled printed circuit board and cell pieces to cause soldering of said rears of said pieces to said piece mounting pads and which serve to rigidly hold the cell pieces on the piece mounting pads and where the solder provides the primary mounting force, in absence of an adhesive, for holding each piece and the LED on the piece mounting pads and LED on the LED mounting pads; and g. electrically connecting said conductive sides to said islands.

* * * * *